United States Patent
Kikuchi et al.

[11] Patent Number: 5,399,202
[45] Date of Patent: Mar. 21, 1995

[54] RESIST-PEELING LIQUID AND PROCESS FOR PEELING A RESIST USING THE SAME

[75] Inventors: Hiroshi Kikuchi, Zushi; Yasushi Sano, Yokohama; Satoru Todoroki, Yokohama; Hitoshi Oka, Yokohama; Toshiyuki Koshita, Mobara; Masato Kikuchi, Mobara; Mitsuo Nakatani, Mobara; Michio Tsukii, Mobara, all of Japan

[73] Assignee: Hitachi, Ltd., Tokyo, Japan

[21] Appl. No.: 986,683

[22] Filed: Dec. 8, 1992

[30] Foreign Application Priority Data

Dec. 19, 1991 [JP] Japan ................. 3-336600

[51] Int. Cl.6 .............. B08B 3/08; B08B 3/10
[52] U.S. Cl. ...................... 134/1; 134/23; 252/544; 252/548
[58] Field of Search .......... 252/544, 548; 134/1, 134/38

[56] References Cited

U.S. PATENT DOCUMENTS

| | | | |
|---|---|---|---|
| 3,663,445 | 5/1972 | Augustin et al. | 252/548 |
| 3,671,465 | 6/1972 | Murphy | 134/38 |
| 3,813,309 | 5/1974 | Bakes et al. | 134/38 |
| 4,617,251 | 10/1986 | Sizensky | 252/548 |
| 4,765,844 | 8/1988 | Merrem et al. | 134/38 |
| 4,792,416 | 12/1988 | Shimizu | 252/548 |
| 4,891,160 | 1/1990 | Vander Meer | 252/548 |
| 5,075,040 | 12/1991 | Rivenaes | 252/548 |
| 5,090,432 | 2/1992 | Bran | 134/1 |
| 5,100,476 | 3/1992 | Mase et al. | 134/1 |
| 5,102,777 | 4/1992 | Lin et al. | 134/3 |
| 5,279,771 | 1/1994 | Lee | 252/548 |

FOREIGN PATENT DOCUMENTS

| | | | |
|---|---|---|---|
| 61-20946 | 1/1986 | Japan | 134/38 |
| 2-157067 | 6/1990 | Japan | 134/38 |

OTHER PUBLICATIONS

Hammond et al., "Removal of polyamide—polyimide compounds", IBM Tech. Disc. Bull., vol. 22, No. 3 Aug. 1979, p. 938.

*Primary Examiner*—R. Bruce Breneman
*Assistant Examiner*—Matt Whipple
*Attorney, Agent, or Firm*—Antonelli, Terry, Stout & Kraus

[57] ABSTRACT

A resist is peeled without leaving a residue after peeling, by bringing a resist-peeling liquid comprising a primary aliphatic amine of 2-6 carbon atoms into contact with the surface of an etched novolak positive photoresist, and removing the resist-peeling liquid containing the thus peeled resist from the surface of the etched resist. The used resist-peeling liquid can easily be recovered and regenerated.

8 Claims, 5 Drawing Sheets

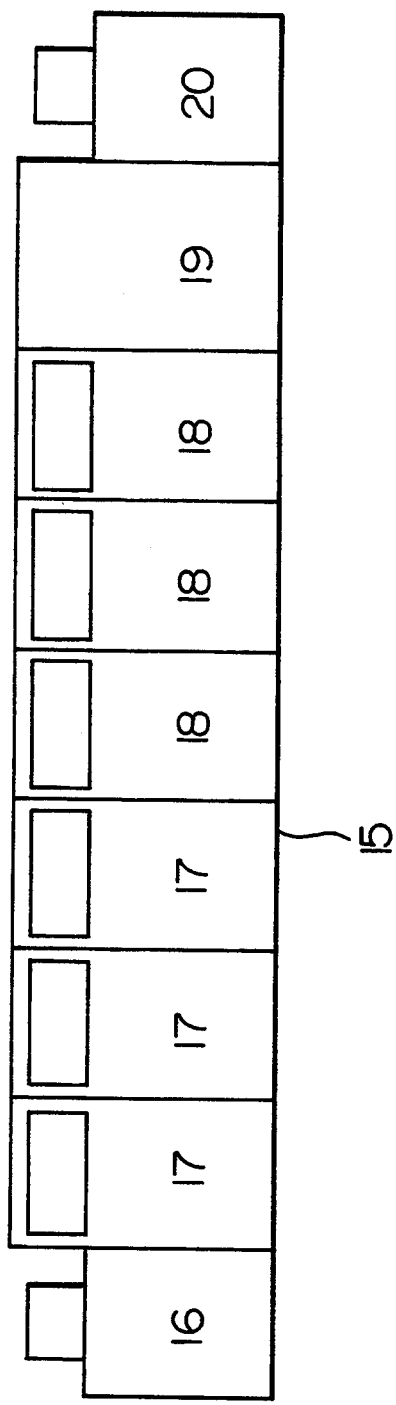

RESIST-PEELING LIQUID AND PROCESS FOR PEELING A RESIST USING THE SAME

BACKGROUND OF THE INVENTION

1. Field of the Invention

The present invention relates to a resist-peeling liquid necessary for forming a thin film pattern of an electrically conductive circuit or an insulator for production of various electronic devices. Furthermore, it relates to a process for peeling a resist by the use of the peeling liquid.

2. Description of the Related Art

As a process for producing an electronic device such as a liquid crystal display device, a semiconductor device, or any of various circuit base plates, there has been well known to those skilled in the art a process which comprises forming a thin film by sputtering or the like, forming a predetermined pattern on the thin film by the use of a photoresist by photolithography, removing unnecessary portions by etching, peeling off the photoresist and repeating the above procedure, thereby producing a product. In such a series of steps, it is absolutely necessary that the photoresist-peeling step be perfect. Therefore, various proposals have been made for a resist-peeling liquid used for efficiently peeling a resist.

For example, JP-A-57-165834 discloses an amine type resist-peeling liquid, and JP-A-62-35357 discloses a phenol type resist-peeling liquid.

The above resist-peeling liquids are well known to those skilled in the art but involve the following problems in practical application.

An explanation is given below by taking the case of a novolak positive resist which is most generally used as a photoresist. In production processes of various electronic devices, a resist formed on a substrate is irradiated with ultraviolet light through a predetermined mask, after which the exposed portion is removed by development, and the remaining resist is used as an etching resist. Concrete etching conditions vary depending on a substance to be etched, and etchings usable in this case are roughly classified into two classes: wet etching utilizing an electrochemical reaction in a solution, and dry etching utilizing the reaction of a radical in a gas phase.

Depending on the etching conditions of these processes, complicated chemical reactions are often caused on the surface of the resist. The change in quality of the surface layer of the resist by the reactions brings difficulty in completely peeling off the photoresist by the use of a conventional resist-peeling liquid. The incomplete peeling leaves a resist residue on the pattern or between the patterns formed by etching. Even when the amount of the residue is very small, the residue is a great factor causing defects such as burnout, short circuit, etc. in the subsequent steps such as film formation, photolithography, etching, etc. These defects decrease the reliability and yield of a product and hence cause inestimable losses in performance characteristics and economical benefit.

The above-mentioned conventional peeling liquids cannot cope with such a problem. In addition, there has been no method capable of solving such a problem and the problem of change in quality of the resist surface caused depending on various etching conditions, at the same time. Therefore, for coping with these problems, there has been no choice but, for example, to elongate the resist-peeling time, depending on etching conditions.

The present invention is intended to provide a resist-peeling liquid of extremely high performance which can completely peel the resist having a portion of which quality has been changed during the above-mentioned etching process and does not leave the residue to the subsequent steps, and a process for peeling a resist by the use of the resist-peeling liquid.

In addition, since the above-mentioned conventional peeling liquids have a complicated composition, it has been very difficult to separate a resist from the peeling liquid after being used for peeling the resist, recover the peeling liquid and regenerate the same. Due to the complicated composition, even when a general separating method (e.g. distillation) is employed, a liquid recovered by distillation has a composition different from that of the original peeling liquid. Therefore, there has been no choice but to readjust the composition of the recovered liquid after analysis for its components. Such regeneration imposes a heavy economic burden, and disposal of the peeling liquid by a method such as incineration has been easier than the regeneration.

However, since it is obvious that the disposal by incineration of a large amount of the resist-peeling liquid composed mostly of one or more organic solvents has an undesirable influence on the global environment, there has been desired to develop a resist-peeling liquid which is free from the above problems and easy to recover and regenerate.

A second object of the present invention is to provide the aforesaid resist-peeling liquid which is easy to recover and regenerate.

SUMMARY OF THE INVENTION

According to the present invention, there are provided a resist-peeling liquid comprising 80% by weight or more of a primary aliphatic amine of 2 to 6 carbon atoms; and a process for peeling a resist which comprises the steps of (1) bringing a resist-peeling liquid comprising 80% by weight or more of a primary aliphatic amine of 2 to 6 carbon atoms into contact with the surface of an etched novolak positive photoresist, and (2) removing the resist-peeling liquid containing the thus peeled resist from the surface of the etched resist.

Compounds suitable for the resist-peeling liquid of the present invention are primary aliphatic amines of 2–6 carbon atoms. They are preferably compounds of 2–6 carbon atoms having in the molecule one or two hydroxyl groups and one amino group with the proviso that the hydroxyl and amino groups are not bonded to the same carbon atom. They are characterized by the following general formula (1):

$$HO\text{-}R\text{-}NH_2 \qquad (1)$$

wherein -R- is an alkylene group of 2–6 carbon atoms which optionally carries a hydroxyl group.

Specific examples of the compounds suitable for the resist-peeling liquid of the present invention are 2-amino-1-ethanol, 1-amino-2-propanol, 2-amino-1-propanol, 1-amino-2-butanol, 2-amino-1-butanol, 5-amino-1-pentanol, 6-amino-1-hexanol, 3-amino-1,2-propanediol, etc. Of these, 2-amino-1-ethanol, 1-amino-2-propanol and 2-amino-1-propanol which have a low molecular weight, are preferable due to the high penetrability into resist materials. 2-Amino-1-ethanol is most preferable.

As a result of various investigations, the content of the primary aliphatic amines of 2-6 carbon atoms which are suitable for the resist-peeling liquid of the present invention is 100 to 80% by weight, preferably 100 to 90% by weight, more preferably 100 to 95% by weight. The above lower limit of the content is determined so as to permit the complete peeling of not only a resist not having a portion of which quality has been changed but also a resist having a portion of which quality has been changed by etching. Since such restriction on the content may be unnecessary for peeling off a resist not having a portion of which quality has been changed, it should be particularly emphasized that the present invention is very effective in peeling a resist having a portion of which quality has been changed.

In peeling the resist having a portion of which quality has been changed, not only the above-mentioned primary aliphatic amines of 2-6 carbon atoms are effective. There may also be used aliphatic amines having no OH group, such as ethylene diamine and triethylenetetramine, etc., and aromatic amines such as aniline, anisidine, etc. Practically, however, the toxicity of a peeling liquid is required to be low. From this point of view, its $LD_{50}$ in oral administration is preferably 2,000 mg/kg or more. In addition, for preventing the evaporation of the peeling liquid and lowering its flammability, its boiling point is preferably about 150° or higher. Therefore, practically applicable peeling liquids should be selected by considering the peeling capability for the resist having a portion of which quality has been changed, the safety and the cost factor. Furthermore, for economical recovery and regeneration of the resist-peeling liquid after use, the number of components of the peeling liquid is preferably small. In practice, the peeling liquid is preferably composed of one component. In the present invention, as a result of various investigations, there has been found as a peeling liquid satisfying all of such requirements a peeling liquid comprising the above-mentioned primary aliphatic amine of 2-6 carbon atoms in a purity of 80% by weight or more.

The resist-peeling liquid of the present invention is suitable particularly for peeling a layer formed by the change in quality on the surface of a resist, which change in quality is caused by a strongly oxidative wet etching solution of metallic chromium, dry etching of silicon or aluminum, dry etching using oxygen plasma, or ion implantation.

As an operating temperature suitable for peeling a resist by the use of the resist-peeling liquid of the present invention, any temperature between room temperature and the boiling point of the liquid may be employed, although a temperature of 30°-90° C. is preferable and a temperature of 40°-70° C. is more preferable. Such a temperature condition is determined so as to permit the peeling of the resist in a short time, reduce the loss of the peeling liquid by evaporation, and prevent the ignition of the peeling liquid.

For peeling a resist by the use of the resist-peeling liquid of the present invention, simply carrying out the following steps is sufficient: the resist-peeling liquid is brought into contact with the surface of the etched resist, after which the resist-peeling liquid containing the photoresist thus peeled off is removed from the surface of the etched resist. A method for the peeling is not critical. There may be employed the so-called immersion peeling, in which a substrate having a resist to be peeled off is immersed in a peeling liquid for a prescribed period of time. The so-called spray type peeling method, in which a peeling liquid is supplied to a resist by spraying, is more preferable for shortening the peeling time. The so-called ultrasonic peeling method, in which ultrasonic waves are applied to a peeling liquid during immersion peeling, is more preferable for shortening the peeling time greatly.

To recover and regenerate the resist-peeling liquid of the present invention, merely conducting the distillation of the peeling liquid is sufficient.

In general, the solubility of a macromolecular material such as a resist in a solvent such as a peeling liquid is often discussed by relating it to the solubility parameter of the material in the solvent. However, the solubility can be explained on the basis of the solubility parameter only when the dissolution reaction is governed by an interaction based on van der Waals force. In the case of a system in which the dissolution reaction is governed by an interaction other than the above interaction, there is no choice but to experimentally investigate the solubility.

The peeling effect of a resist-peeling liquid can be understood as an effect brought about by combination of the following two actions: the peeling liquid rapidly penetrates into a solid resist material to swell the resist, and it dissolves the swollen resist material. In general, in the case of novolak positive resists, the major part of resist material is composed of a cresol novolak resin having a high molecular weight, and the remaining part is composed of, for example, a photosensitizer having a relatively low molecular weight. The novolak positive resists are described in detail in W. S. DeForest, "Photoresist" Chapter 2, Types of Photoresist, pp. 19–60, Chapter 5, Positive Resist, pp. 132–162, McGraw-Hill, 1975. For peeling such novolak positive resists, it is absolutely necessary to use a peeling liquid having high capability of dissolving novolak resins having a high molecular weight, which are inherently difficult to be dissolved.

In addition, it is speculated that in a resist having a portion of which quality has been changed on the surface by an etching process or the like, the cross-linking between the molecules of the resist material has proceeded owing to the action of high-energy plasma particles, etc., so that the resist material has an markedly high molecular weight. For rapid swelling and dissolution of not only the portion of which quality has been unchanged but also the portion of which quality has been changed, marked improvement of the dissolving ability of a peeling liquid is necessary.

From this point of view, there was investigated the solubility of a resist material of which quality has been changed, in various solvents. Consequently, it was experimentally found that the best peeling effect can be obtained by the use of the resist-peeling liquid of the present invention.

Since the primary aliphatic amine of 2-6 carbon atoms used in the resist-peeling liquid of the present invention contains a basic amino group in the molecule, it has a very high affinity for novolak resins (which are weakly acidic compounds), penetrates into a resist easily, and can dissolve not only the resist portion of which quality has been unchanged but also the resist portion of which quality has been changed, in a short period of time. In the present invention, for making the best use of such desirable property of the aliphatic amines, it is preferable to make the activity of the aliphatic amine in the peeling liquid as high as possible. From this point of view, the peeling liquid contains 80% by weight or more, preferably 90% by weight or more, more preferably 95% by weight or more, of the primary aliphatic amine of 2–6 carbon atoms.

On the other hand, also for recovery and regeneration of the peeling liquid after use, it is very advantageous that the peeling liquid contains a high concentration of the aliphatic amine. In detail, the components of a resist dissolved in the peeling liquid can easily be separated from the peeling liquid merely by applying a separating method such as distillation to the used peeling liquid. Hence there can be removed the economic burden imposed by analysis for and adjustment of the components after the distillation. A method for the regeneration in the present invention is not limited to distillation. There can be employed separating methods other than distillation, for example, membrane separation. The employment of the other separating methods is, as a matter of course, made possible by the employment of a high concentration of the aliphatic amine in the present invention. The choice of the separating method depends mainly on economic reasons in itself, and it should be emphasized that whatever separating method may be employed, the above effect can be obtained, namely, the economic burden imposed by analysis for and adjustment of the components can be removed.

BRIEF DESCRIPTION OF THE DRAWING

FIG. 7 shows an apparatus for peeling a resist for liquid crystal display.

Figure 1A:
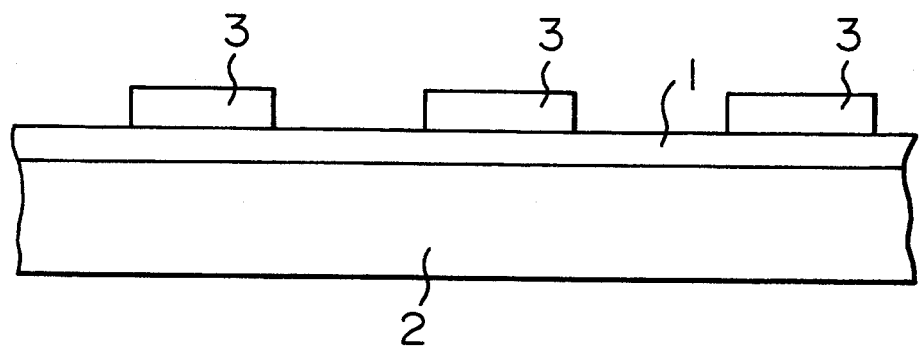
FIG. 1 shows a peeling procedure.

In the drawings, 1 shows a chromium thin film,
2 shows a glass substrate,
3 shows a photoresist,
4 shows a layer of which quality has been changed,
5 shows a residue left after peeling,
6 shows the area of an original resist,
7 shows a spray type peeling bath,
8 shows a pump,
9 shows a filter,
10 shows a peeling liquid,
11 shows a spray nozzle,
12 shows a substrate,
13 shows an ultrasonic peeling bath,
14 shows an ultrasonic generator,
15 shows a sheet-fed type resist-peeling apparatus,
16 shows a loader,
17 shows a spray peeling unit,
18 shows a pure-water-spray washing unit,
19 shows a heating and drying unit,
20 shows an unloader,
21 shows data obtained for 2-amino-1-ethanol,
22 shows data obtained for 1-amino-2-propanol,
23 shows data obtained by immersion,
24 shows data obtained by spraying,
25 shows data obtained by application of ultrasonic waves,
26 shows data obtained for a protic solvent,
27 shows data obtained for an aprotic solvent,
28 shows data obtained for a chlorine-containing solvent,
29 shows data obtained for 2-amino-1-ethanol.

DESCRIPTION OF THE PREFERRED EMBODIMENTS

Examples are described below for explaining the present invention in further detail.

EXAMPLE 1

An example is explained below with reference to the diagram of a peeling procedure shown in FIG. 1.

A glass substrate 2 (10 cm square, 1.1 mm thickness) having a thin chromium film 1 (150 nm thickness) on the surface was prepared by sputtering. Onto the whole surface of the chromium film 1, a novolak positive photoresist (OFPR-800, mfd. by Tokyo Ohka Kogyo Co., Ltd.) was applied so as to form a layer having a thickness of 2 $\mu$m with a spinner. Then, the resulting body was baked at 120° C. for 30 minutes. Thereafter, the baked body was exposed to light and developed according to a conventional method, to form an etching resist pattern 3 on the chromium (FIG. 1a).

Figure 1B:
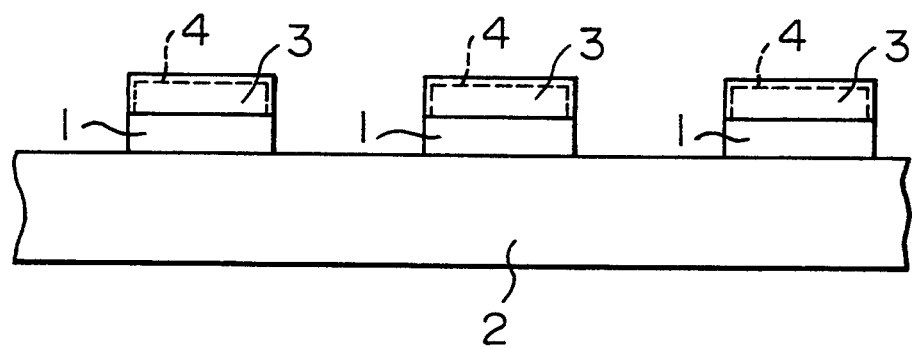

Thereafter, the body having an etching resist pattern on the surface was immersed in a conventional chromium etching solution (composed mainly of cerium nitrate ammonium), to dissolve away the exposed chromium portions. Then, the resulting body was washed with water and dried. By the above procedure, a very thin layer 4 of which quality has been changed was formed on the surface layer of the resist (FIG. 1b).

Figure 1C:
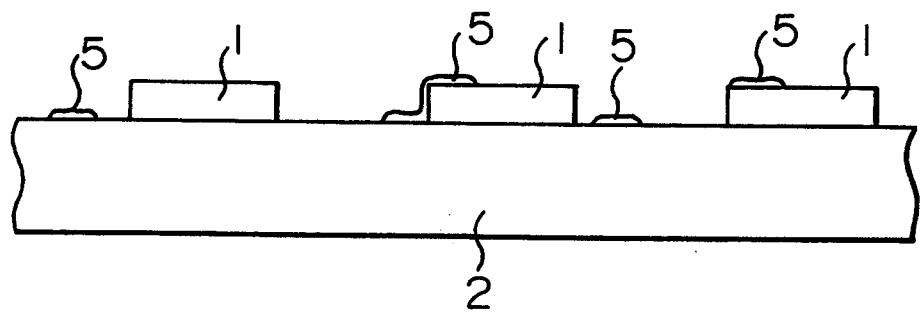

Then, the dried body was immersed in any one of the resist-peeling liquids described below, to peel off the resist. The resist-peeled body was rinsed with deionized water and then dried. Thereafter, the whole surface of the resulting body was inspected with an optical microscope for observation of the state of peeling off of the resist and for determination whether residues 5 were left adhered to the chromium wiring or in the spaces between the chromium wirings. Based on the results of the inspection, the peeling capability of the peeling liquids were compared (FIG. 1c).

As a control, a resist was peeled off from a body having an etching resist pattern which body had not yet been immersed in the chromium etching solution. Thus, the influence of the etching operation on the peelability of the resist was investigated.

As representative choices from aliphatic amines, 2-amino-1-ethanol (monoethanolamine, a primary amine), diethanolamine (a secondary amine), and triethanolamine (a tertiary amine) were selected. The peeling capability of these amines were tested by using them as a peeling liquid.

Specifically, the test was conducted as follows:

Three peeling-liquid baths containing the same fresh peeling liquid were prepared. They were heated to 60° C. The chromium-etching body was immersed successively in the three baths for 2 minutes each, whereby peeling was conducted for 6 minutes in total. The above procedure was carried out for the above three kinds of the peeling liquids for comparing their peeling capability.

Figure 2:
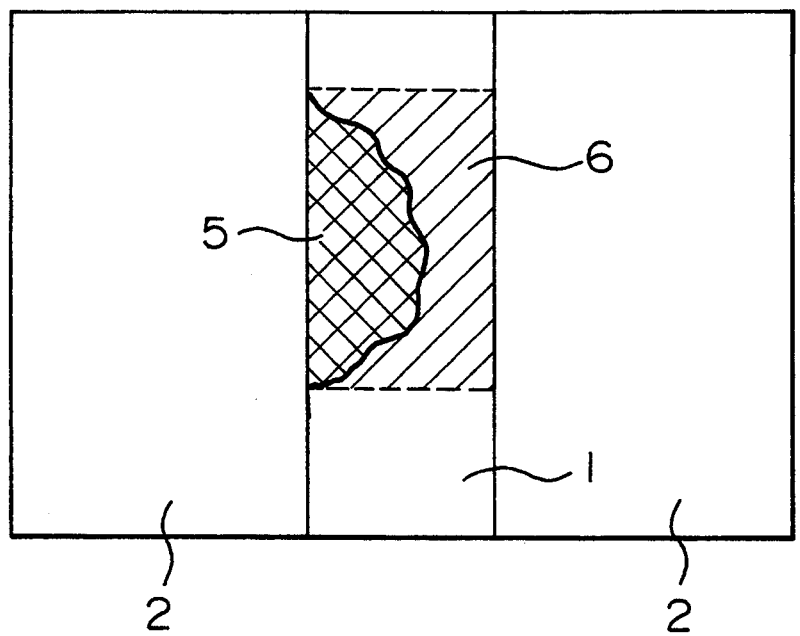
FIG. 2 shows a method for calculating the percentage of residue left after peeling.

The peeling capability was determined by the observation of the surface of the body after peeling as follows. A state in which the residue remained in the form of a thin film over the whole surface of the resist pattern after peeling was judged as unsatisfactory peeling. A state in which the residue had been completely removed off from the surface of the pattern and from the space between the patterns after peeling was judged as complete peeling. An intermediate state between the above two states, i.e. a state in which the residue partly remained on the pattern or between patterns in the form of a thin film, was judged as partial peeling. The degree of remaining of the residue after peeling was quantitatively expressed by the following method. As shown in FIG. 2, the area of the residue left after peeling 5 which had adhered to the chromium wiring 1 was measured. The ratio of this area to the area of the original resist 6 was calculated according to the following equation defining the percentage of residue left after peeling:

$$\text{Percentage of residue left after peeling (\%)} = \left(\begin{array}{c}\text{Area of}\\\text{residue left}\\\text{after}\\\text{peeling 5}\end{array}\right) / \left(\begin{array}{c}\text{Area of}\\\text{original}\\\text{resist 6}\end{array}\right) \times 100$$

The percentage of residue left after peeling which is calculated by the above method is suitable for evaluating the capability of a peeling liquid, because it permits quantitative treatment of a residue in a very small portion of a wiring and makes it possible to make quantitative the worst case which tends to lead to an unsatisfactory result.

When the percentage of residue left after peeling is employed, it is obvious that only peeling liquids capable of giving a percentage of residue left after peeling of zero are preferable for the production of electronic devices.

In this case, a point to which special attention should be paid is that since the residue adheres to the wiring or spaces between the wiring with high probability, as shown in FIG. 1c, the residue is liable to be overlooked unless the whole surface of the substrate after the peeling is inspected over a large area.

The resist-peeling capability of the above three amino alcohols was compared according to the above quantitation method. Table 1 shows the results. In the peeling off of the resist (A) which had not immersed in the chromium etching solution, all the amino alcohols could achieve complete peeling. There was found no significant difference in resist-peeling capability for the resist (A) between the amino alcohols.

However, surprisingly, in the peeling off of the resist (B) which had immersed in the chromium etching solution, there was a marked difference in peeling capability between the three amino alcohols. The following order of resist-peeling capability was found to hold for the amine moiety in the amino alcohols:

tertiary < secondary < primary.

Monoethanolamine, a primary amine, could easily achieve complete peeling, and the percentage of residue left after peeling was zero. In contrast, triethanolamine, a tertiary amine, caused unsatisfactory peeling, and the percentage of residue left after peeling was 100%. Thus, triethanolamine was of no practical use as a peeling liquid. Diethanolamine, a secondary amine, had a capability intermediate between those of the above two amines. It caused partial peeling in which a small amount of a residue was observed to be left after peeling.

These results demonstrated that the capability of a resist-peeling liquid depends on whether the liquid can easily peel off not only the resist portion of which quality has been unchanged but also the resist portion of which quality has been changed during the production process of an electronic device. Thus, it was fond that when the quality of the surface layer of a resist has been changed during the reaction of a chromium etching solution with the resist by immersing the resist in the etching solution, the capability of a peeling liquid in peeling the resist having such a quality-changed layer on the surface cannot easily be estimated from its peeling capability for the resist having no such layer. Furthermore, it was also found that a peeling liquid capable of peeling off the resist having a layer of which quality has been changed can be selected only by the experimental determination of the capability of a peeling liquid.

That the primary amino alcohol has the highest peeling capability is believed to be due to the strong basicity of the primary amine moiety in the molecule. It should also be emphasized that the present invention has revealed, for the first time, the fact that such a strong base dissolves a resist of which quality has complicatedly been changed.

EXAMPLE 2

The peeling capability of peeling liquids were examined in the same manner as in Example 1 as follows. Specifically, three peeling-liquid baths containing the same fresh peeling liquid were prepared. They were heated to 60° C. A chromium-etched body was immersed successively in the three baths for 2 minutes each, whereby the peeling was conducted for 6 minutes in total. As the peeling liquids, monoethanolamine (2-amino-1-ethanol), which had been found to have the highest peeling capability in Example 1, and isopropanolamine (1-amino-2-propanol), which is also a primary amino alcohol, were selected. For comparing their peeling capability, peeling liquids were prepared by diluting each amino alcohol with propylene glycol ethyl ether as an organic solvent, and the relationship between the amino alcohol concentration and the peeling capability was determined.

Figure 3:
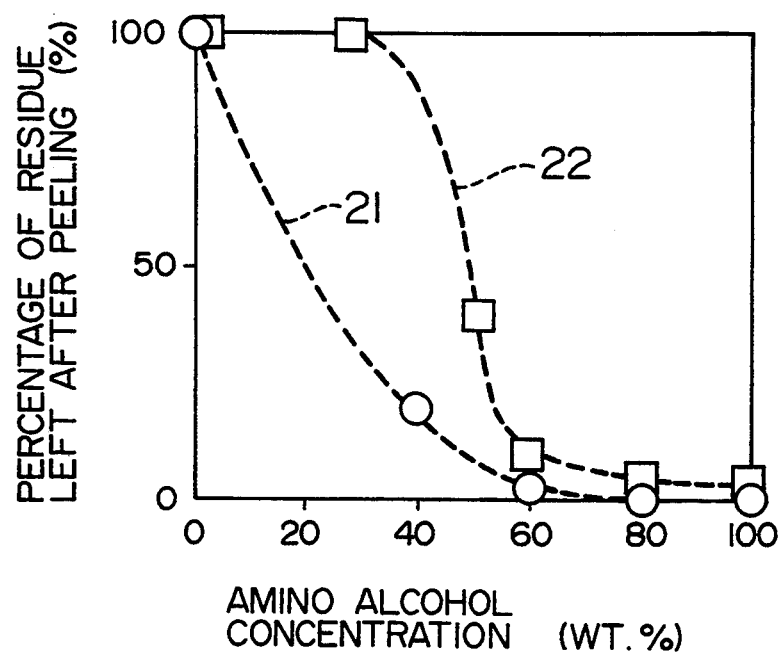
FIG. 3 shows a family of curves of percentage of residue left after peeling vs. amino alcohol concentration at different amino alcohol species.

FIG. 3 shows the results. As seen in FIG. 3, it was found that the amount of a residue left after peeling was decreased, even when the resist had a surface portion of which quality had been changed by the chromium etching, as the concentration of the amino alcohol got close to 100% by weight. In particular, it was found that for attaining the best peeling capability, the concentration of amino alcohol should be adjusted to 80% by weight or more, preferably 90% by weight or more, more preferably 95% by weight or more. It was also found that for peeling off the resist having a portion of which quality had been changed, a concentration at which the activity of the amino alcohol is the highest should be chosen within the above range.

In addition, it was found that when the primary amino alcohols were compared with each other, monoethanol-amine capable of giving a percentage of residue left after peeling of zero is preferable to isopropanolamine which gave a percentage of residue left after peeling of several percent even when its concentration was 95% by weight or more. It is conjectured that such a difference is due mainly to the difference in molecular weight between the amino alcohols. The amino alcohol having a lower molecular weight was found to have a higher peeling capability.

EXAMPLE 3

Peeling liquids were examined for peeling capability according to the same manner as in Example 1 as follows. Specifically, three peeling liquid baths containing the same fresh peeling liquid were prepared. They were heated to 60° C. A chromium-etched body was immersed successively in the three baths for 2 minutes each, whereby the peeling was conducted for 6 minutes in total. The peeling liquids were prepared by mixing each of various organic solvents with monoethanolamine, which had been found to have the highest peeling capability in Examples 1 and 2. The relationship between the proportion of monoethanolamine and the peeling capability was determined.

Table 2 shows the result. As seen in Table 2, it was found that irrespective of the kind of the organic solvent mixed, even the resist (B) having on the surface a portion of which quality had been changed by chromium etching solution was completely peeled off within the amino alcohol proportion range of about 80% by weight or more. In other words, the highest peeling capability could be attained within this range. In addition, it was found that the resist (A) having on the surface a portion of which quality had been unchanged could be completely peeled off by the use of any of the peeling liquids, regardless of the proportion of monoethanolamine. On the basis of these results, it was found, as in Example 2, that for peeling the resist having a portion of which quality had been changed, the proportion of the amino alcohol should be selected within the high concentration region so as to obtain the highest capability.

These results also demonstrated that the present invention is remarkably effective particularly in peeling a resist having a portion of which quality has been changed, and that such an effect has been quite unpredictable from the peeling capability for a resist having no such quality-changed portion.

Furthermore, it was also found that the range of the optimum proportion of the amino alcohol slightly varies depending on the operation temperature of the peeling liquid. That is, it was also found that in operation at a relatively low temperature, the proportion of the amino alcohol is preferably high, namely, 90% by weight or more. In addition, it was found that a peeling liquid containing the amino alcohol in a proportion of 95% by weight or more is the most preferable. This is because the amino alcohol serving as peeling liquid is a compound available as a solvent, so that the economic burden imposed by preparation of a resist-peeling liquid by addition of other solvents can be removed. Moreover, the restriction on the operating temperature is not severe.

EXAMPLE 4

Peeling liquids were examined for peeling capability according to the same manner as in Example 1 as follows. Specifically, three peeling liquid baths containing the same fresh peeling liquid were prepared. They were heated to 60° C. A chromium-etched body was immersed successively in the three baths for 2 minutes each, whereby the peeling was conducted for 6 minutes in total. As the peeling liquids, monoethanolamine, which had been found to have the highest peeling capability in Example 1, and other various primary amines having a chemical structure closely related to that of monoethanolamine were selected and examined.

The amino alcohol used in the above examination were monoethanolamine (2-amino-1-ethanol), 1-amino-2-propanol, 2-amino-1-propanol, 1-amino-2-butanol, 2-amino-1-butanol, 5-amino-1-pentanol, 6-amino-1-hexanol, and 3-amino-1,2-propanediol.

Table 3 shows the results. As seen in Table 3, monoethanolamine can completely peel off either the resist (B) having on the surface a portion of which quality has been changed by the chromium etching and the resist (A) having no such portion. It was also found that when used for peeling the resist having a portion of which quality has been changed, the amino alcohols having a higher molecular weight than that of monoethanolamine can achieve substantially complete peeling, although they cause formation of a residue left after peeling in a small amount of several percent.

It was also demonstrated that the above advantage can be obtained by the employment of the peeling liquid of the present invention. It was also found that of the various primary amino alcohols, those having the lower molecular weight have a higher penetrability into the resist and as a result permit the completion of peeling operation at a lower temperature in a shorter period of time.

EXAMPLE 5

Peeling liquid were examined for peeling capability according to the same manner as in Example 1 as follows. Specifically, three peeling liquid baths containing the same fresh monoethanolamine were prepared. They were heated to 60° C. Bodies suffered from various conventional etching treatments were immersed successively in the three baths for 2 minutes each, whereby the peeling was conducted for 6 minutes in total. Table 4 shows the results. It was found that the peeling liquid of the present invention is very effective not only in peeling the resist having a portion of which quality has been changed by chromium etching but also in peeling the resist having a portion of which quality has been changed by dry etching treatments with Si, SiN, etc. generally used for manufacturing an electronic device. Moreover, it was also found that the peeling liquid of the present invention is effective not only in peeling the resist having a portion of which quality has been changed by etching treatment but also in peeling the resist having a portion of which quality has been changed by an operation such as ion implantation.

EXAMPLE 6

Peeling liquids were examined for peeling capability according to the same manner as in Example 1 as follows. Specifically, three peeling liquid baths containing the same fresh peeling liquid heated to a prescribed temperature were prepared. A chromium-etched body was immersed successively in the three baths for 2 minutes each, whereby the peeling was conducted for 6 minutes in total. As the peeling liquids, monoethanolamine, which had been found to have the highest peeling capability in Example 1, was selected.

As a result, it was found that the peeling liquid of the present invention is markedly effective within a wide temperature range of from room temperature to an elevated temperature higher than 100° C. For preventing the ignition of the peeling liquid and the loss of the peeling liquid due to evaporation, the operating temperature is preferably low. From this point of view, the operating temperature is preferably 90° C. or lower, more preferably 70° C. or lower.

On the other hand, for shortening the period of time for peeling a resist, the operating temperature is preferably high. From this point of view, the operating temperature is preferably 30° C. or higher, more preferably 40° C. or higher.

EXAMPLE 7

Figure 4:
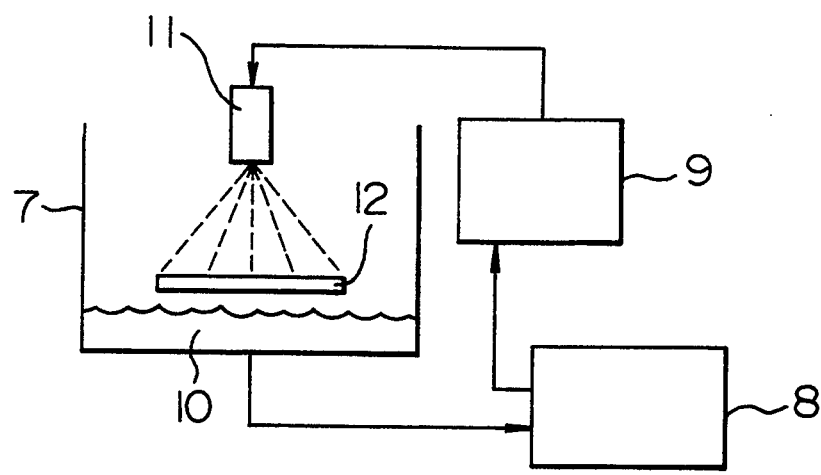
FIG. 4 shows the structure of a spray type peeling apparatus.

For providing a method for more effective utilization of the resist-peeling liquid of the present invention, monoethanolamine was used as the peeling liquid and there was investigated the effect of spray peeling in which the peeling liquid was supplied by the use of a spray type peeling apparatus. It was found that such a method employing the spray peeling is a more effective peeling method, because in this method, a resist is peeled off by simultaneous use of the chemical dissolving power of the peeling liquid and hydrodynamic energy supplied by spraying. FIG. 4 shows a resist-peeling apparatus used. In this apparatus, the peeling liquid 10 was introduced into a spray nozzle 11 from the drain of a spray type peeling bath 7 subjected to temperature adjustment to 60° C. (not shown), through a pump 8 and a filter 9, and sprayed on the resist on a substrate 12.

Figure 5:
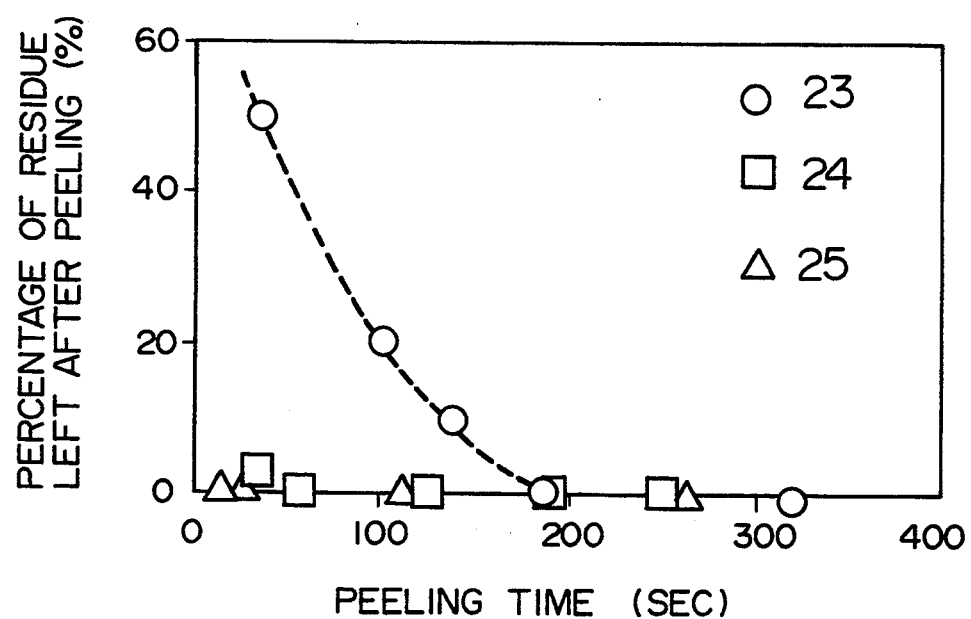
FIG. 5 shows a family of curves of percentage of residue left after peeling vs. peeling time at different peeling methods.

The use of this apparatus with pressurizing the peeling liquid to about 1 kgf/cm$^2$ by a pump shortened the period of time required for complete peeling as compared with the use of immersion peeling. As shown in FIG. 5, more immersion of the body in the peeling liquid at rest took about 3 minutes or more to complete the peeling. In contrast, the use of spray peeling surprisingly reduced the period of time for completing the peeling to about 1 minute.

It should be emphasized that it was the use of the peeling liquid of the present invention having a very high chemical dissolving power that gave the above advantage and the advantage was not obvious at all prior to the present invention. This is because a portion of which quality has been changed formed on the surface layer of a resist would not be completely removed by the use of a peeling liquid having a low ability to dissolve such a portion and the portion would be left after peeling as a residue, although the spraying treatment accelerates the dissolution of the portion of which quality has not been changed.

EXAMPLE 8

Figure 6:
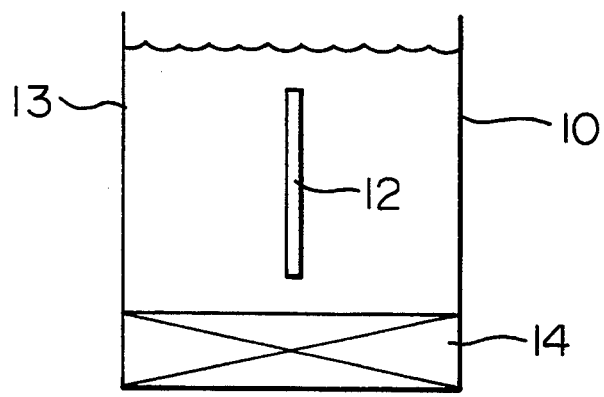
FIG. 6 shows the structure of an ultrasonic peeling apparatus.

For providing a method for more effective utilization of the resist-peeling liquid of the present invention, monoethanolamine was used as the peeling liquid and there was investigated the effect of ultrasonic peeling in which ultrasonic waves were applied to the peeling liquid. There was employed a method in which the ultrasonic peeling bath 13 shown in FIG. 6 was filled with the peeling liquid 10 which had been subjected to temperature adjustment to 60° C. (not shown), the resist on a substrate 12 was peeled off while applying ultrasonic waves to the peeling liquid from an ultrasonic generator 14 provided in the bottom of the bath.

As shown in FIG. 5, this method was found to be a more effective peeling method, because the chemical dissolving power of the peeling liquid and the effects of the sound brought about by the ultrasonic waves can be cooperatively used at the same time for peeling the resist. Specifically, conducting the peeling by applying ultrasonic waves at 44 kHz and 400 W in an ultrasonic generating bath could shorten the period of time for complete peeling as compared with the immersion peeling or the spray peeling. The immersion peeling took about 3 minutes or more for complete peeling. In contrast, surprisingly, the ultrasonic peeling took only about 30 seconds or less for complete peeling.

It should be emphasized as in Example 7 that it was the use of the peeling liquid of the present invention having a very high chemical dissolving power that gave the above advantage and the advantage was not obvious at all prior to the present invention.

EXAMPLE 9

An example of the employment of the above-mentioned peeling liquid of the present invention for the production of a liquid crystal display base plate is described below. Resist peeling was tried using the sheet-fed type resist-peeling apparatus 15 shown in FIG. 7 during the formation of a thin film transistor (TFT) device and a wiring on a 200 mm × 270 mm glass substrate. The apparatus was composed of a loader 16 for continuously introducing substrates (not shown) into the peeling apparatus 15; spray peeling units 17 equipped with horizontal conveyance, heating, a circulating filter and a spray; pure-water-spray washing units 18; a heating and drying unit 19; and an unloader 20; these elements being connected in this order.

About 50 liters of monoethanolamine was introduced into each spray peeling unit 17, heated to 60° C., and then used for spray peeling. Bodies to be tested were prepared by chromium etching employed in a production process of a TFT base plate, wet etching of an ITO transparent electrode, or dry etching of a-Si or SiN. The resist of the thus prepared bodies was peeled off from the glass substrate with the apparatus. Thereafter, the bodies of which resist had been peeled off were observed to determine whether a residue was left after peeling on the substrate. As a result, it was confirmed that the resist could be completely peeled off without leaving a residue for all the bodies tested in spite of the difference in etching processes.

The results shows that the resist-peeling liquid of the present invention has a very high performance in practical use and is suitable for production of liquid crystal devices and semiconductor devices.

EXAMPLE 10

After having been used for the resist peeling in Example 9, the used resist-peeling liquid of the present invention was distilled at 170° C. by a method known to those skilled in the art, recovered, regenerated, and then reused for resist peeling. Since the resist-peeling liquid of the present invention hardly contained components other than the specified aliphatic amine and was composed of substantially one component, the recovery rate by the distillation reached about 95% or more, and the capability of the regenerated resist-peeling liquid was equal to that of the fresh one.

Comparative Example

The resist-peeling liquid of the present invention was compared with other peeling solvents in characteristics by the following two methods. One method is a method of measuring the percentage of residue left after peeling by the same procedure as in Example 1. Another method is a method of measuring a time required for dissolution of a resist of 4 μm in thickness. As described above, the measurement of the percentage of residue left after peeling corresponds to the determination of the peeling capability for a resist having a portion of which quality has been changed by etching. The measurement of the time required for the dissolution corresponded to the determination of the time required for the peeling. With respect to these items, amino alcohols were compared with polar solvents having a high boiling point (about 150° C. or higher) and a high water-solubility in peeling capability. The temperature at peeling was 60° C. in every case. The percentage of the residue left after peeling was measured after conducting peeling for 6 minutes using each solvent.

Figure 8:
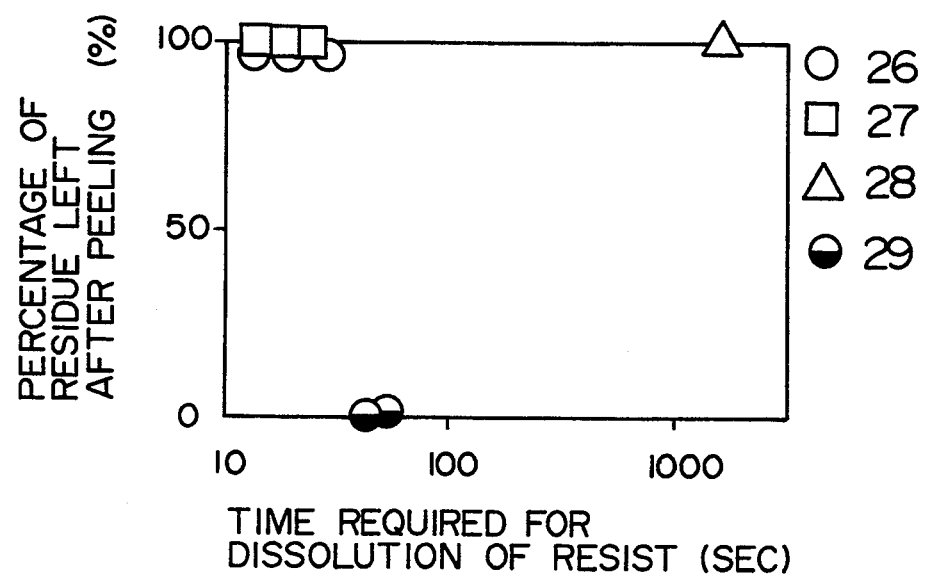
FIG. 8 shows a family of plots of percentage of residue left after peeling vs. time required for dissolution of a resist at different solvents.

FIG. 8 shows the results. For the aprotic solvents (e.g. N-methyl-2-pyrrolidone, dimethyl sulfoxide and propylene carbonate) and the protic polar solvents (e.g. butyl Cellosolve, dipropylene glycol methyl ether and butyl lactate), the time required for dissolution of the resist ranged from 20 to 60 seconds. The time falled within the practically short peeling time. However, when these solvents were applied to the resist having a portion of which quality had been changed, the percentage of the residue left after peeling was 100% even after a period of 6 minutes. Thus, these solvents were found to be quite unsuitable for peeling the resist having a portion of which quality had been changed. For chlorine-containing solvents (e.g. o-dichlorobenzene), the time required for dissolution of the resist was so long that such solvents cannot be practically applied. Moreover, the percentage of residue left after peeling was 100% for chlorine-containing solvents.

In contrast, for monoethanolamine, isopropanolamine and the like, which are representative choices from the peeling liquid of the present invention, the time required for the dissolution of the resist of 4 μm in thickness was within the range of 50 to 60 seconds. The time falls within the practically short peeling time. Moreover, these amines left little or no residue after peeling. Furthermore, these amines show very high peeling capability for the resist having a portion of which quality has been changed.

As described above, according to the present invention, there are provided a resist-peeling liquid of extremely high performance which can completely peel not only a resist not having a portion of which quality has been changed but also a resist having a portion of which quality has been changed by any of various etching processes and does not leave a residue to a subsequent step, and a process for peeling a resist by the use of said resist-peeling liquid. Therefore, it has become possible to produce a liquid crystal display device or a semiconductor device in a very high yield, and it has become possible to provide a highly reliable electronic device at a much lower cost, as compared with the conventional methods. Furthermore, the resist-peeling liquid of the present invention can be recovered and regenerated very economically and hence is advantageous also in that the influence of incineration and disposal of the liquid on the environment can be greatly reduced.

Such technical, economical and environmental advantages attained by the present invention are immeasurable.

TABLE 1

Kind of Amino Alcohol and Percentage of Residue Left After Peeling

| Peeling liquid | Concentration (wt %) | Resist (A) | Resist (B) |
|---|---|---|---|
| Monoethanolamine (primary) | >95 | 0% | 0% |
| Diethanolamine (secondary) | >95 | 0% | 7% |
| Triethanolamine (tertiary) | >95 | 0% | 100% |

Resist (A): an untreated resist
Resist (B): a chromium-etched resist

TABLE 2

Influence of Dilution with Solvent

| Mono-ethanol-amine concentration (wt %) | Diluent solvent | | | | | |
|---|---|---|---|---|---|---|
| | N-methyl-pyrrolidone | | Butyl cellosolve | | Butyl lactate | |
| | Resist (A) | Resist (B) | Resist (A) | Resist (B) | Resist (A) | Resist (B) |
| 40 | 0% | 100% | 0% | 100% | 0% | 100% |
| 60 | 0% | 5% | 0% | 10% | 0% | 6% |
| 80 | 0% | 0% | 0% | 0% | 0% | 0% |
| >95 | 0% | 0% | 0% | 0% | 0% | 0% |

Resist (A): an untreated resist
Resist (B): a chromium-etched resist

TABLE 3

Relationship between the Kind of Amino Alcohol and Residue

| Peeling liquid | Concentration (wt %) | Resist (A) | Resist (B) |
|---|---|---|---|
| 2-Amino-1-ethanol | >95 | 0% | 0% |
| 1-Amino-2-propanol | >95 | 0% | 4% |
| 2-Amino-1-propanol | >95 | 0% | 3% |
| 1-Amino-2-butanol | >95 | 0% | 5% |
| 2-Amino-1-butanol | >95 | 0% | 5% |
| 5-Amino-1-pentanol | >95 | 0% | 8% |
| 6-Amino-1-hexanol | >95 | 0% | 7% |
| 3-Amino-1,2-propanediol | >95 | 0% | 5% |

Resist (A): an untreated resist
Resist (B): a chromium-etched resist

TABLE 4

Relationship between Substance to be Peeled and Peeling Effect

| Etching condition | Residue left after peeling |
|---|---|
| Chromium etching | 0% |
| $O_2$ usher | 0% |
| Si etching + $O_2$ usher | 0% |
| SiN etching + $O_2$ usher | 0% |

What is claimed is:

1. A process for peeling a resist which comprises the steps of:
   (a) changing the quality of a novolak positive resist layer on a substrate by an oxidative wet etching solution of metallic chromium, dry etching of silicon or aluminum, dry etching using oxygen plasma, or ion implantation,
   (b) contacting the changed resist of step (a) with a liquid comprising 80% by weight or more of 2-amino-1-ethanol, and (c) removing the liquid containing the thus peeled resist from the surface of the etched resist.

2. A process for peeling a resist according to claim 1, wherein the step (d) includes the step of selecting as the resist-peeling liquid a resist-peeling liquid containing 90% by weight or more of the 2-amino-1-ethanol.

3. A process for peeling a resist according to claim 1, wherein the step (b) includes the step of selecting as the resist-peeling iiquid a resist-peeling liquid containing 95% by weight or more of the 2-amino-1-ethanol.

4. A process for peeling a resist according to claim 1, which further comprises the step of:
(d) regenerating the resist-peeling liquid by distillation or membrane separation of the resist-peeling liquid containing the peeled resist.

5. A process for peeling a resist according to claim 1, wherein the step (b) is carried out at 30°–90° C.

6. A process for peeling a resist according to claim 1, wherein the step (b) is carried out by spraying the resist-peeling liquid on the surface of the etched resist.

7. A process for peeling a resist according to claim 1, wherein the step (b) is carried out by immersing the etched resist in the resist-peeling liquid, and applying ultrasonic waves to the resist-peeling liquid.

8. A process for peeling a resist according to claim 1, which further comprises the step of:
(d) rinsing the surface of the etched resist in which the resist has been peeled from the surface, with water.

* * * * *